United States Patent [19]
McClure et al.

[11] Patent Number: 5,625,603
[45] Date of Patent: Apr. 29, 1997

[54] INTEGRATED CIRCUIT WITH UNEQUALLY-SIZED, PAIRED MEMORY COUPLED TO ODD NUMBER OF INPUT/OUTPUT PADS

[75] Inventors: David C. McClure, Carrollton; Thomas A. Teel, Austin, both of Tex.

[73] Assignee: SGS-Thomson Microelectronics, Inc., Carrollton, Tex.

[21] Appl. No.: 477,244

[22] Filed: Jun. 7, 1995

[51] Int. Cl.$^6$ .................................................. G11C 7/00
[52] U.S. Cl. .................... 365/230.03; 365/51; 365/63; 365/189.02; 365/230.02; 365/230.04
[58] Field of Search ...................... 365/230.03, 230.04, 365/230.02, 189.02, 51, 63

[56] References Cited

U.S. PATENT DOCUMENTS

| | | | |
|---|---|---|---|
| 5,121,354 | 6/1992 | Mandalia | 365/230.04 X |
| 5,416,749 | 5/1995 | Lai | 365/230.04 X |
| 5,493,535 | 2/1996 | Cho | 365/230.04 |
| 5,499,216 | 3/1996 | Yamamoto | 365/230.04 X |

Primary Examiner—Do Hyun Yoo
Attorney, Agent, or Firm—Theodore E. Galanthay; Lisa K. Jorgenson

[57] ABSTRACT

An integrated circuit with an integer odd number C of electrical contacts, wherein each of the electrical contacts is for communicating a data value. The integrated circuit also includes four memory arrays for storing data. The first and third memory arrays are operable to simultaneously output an integer even number E of data values. The second and fourth memory arrays are operable to simultaneously output an integer odd number D of data values. The integrated circuit further includes circuitry for selectively coupling the first, second, third, and fourth memory arrays to the electrical contacts, wherein the circuitry for selectively coupling is operable to couple the first and fourth memory arrays to the electrical contacts in a first state so that the first memory array outputs E data values and the fourth memory array outputs D data values in the first state. The circuitry for selectively coupling is also operable to couple the second and third memory arrays to the electrical contacts in a second state so that the second memory array outputs D data values and the third memory array outputs E data values in the second state.

23 Claims, 6 Drawing Sheets

INTEGRATED CIRCUIT WITH UNEQUALLY-SIZED, PAIRED MEMORY COUPLED TO ODD NUMBER OF INPUT/OUTPUT PADS

This invention relates to integrated circuits, and is more particularly directed to an integrated circuit with unequally-sized, paired memory arrays which are selectively coupled to an odd number of input/output pads of the integrated circuit.

BACKGROUND OF THE INVENTION

Integrated circuit memories continue to increase in storage capacity, use, and complexity. With each of these factors, there is an ongoing need to design and manufacture such memories as efficiently as possible, thereby minimizing cost and layout size while maximizing reliability and speed. The present invention balances each of these goals in the context of an integrated circuit having an odd number of input/output ("I/O") contact pads for coupling to a memory. Further, the invention is particularly beneficial where the odd number of I/O contact pads are spread over a relatively large linear region and have a relatively large distance between successive contact pads.

FIG. 1 diagrammatically illustrates an integrated circuit 10 which includes a memory array 12. Memory array 12 includes a plurality of internal data storage locations (not shown). Integrated circuit 10 also includes a plurality of data contact pads $C_1$ through $C_9$ and a plurality of address contact pads $A_1$ through $A_N$. Both types of contact pads (i.e., data or address) are often referred to in the art as bond pads because, once integrated circuit 10 is included in an integrated circuit package, the package includes electrical pins which are electrically connected to respective bond pads via "bond wires". For purposes of the present discussion, however, it is not critical how such connections are made, but rather, only to note that the contact pads provide a contact for electrically communicating either a data or address value.

Memory array 12 includes data contacts $MD_1$ through $MD_9$ which are connected via a data bus 14 to contact pads $C_1$ through $C_9$. Integrated circuit 10 further includes an address decode circuit 16 connected between contact pads $A_1$ through $A_N$ and memory array 12. In operation, data contact pads $C_1$ through $C_9$ may be electrically contacted for communicating data for outputting, inputting, or both outputting and inputting, between each pad and the storage cells of memory array 12 via data bus 14. For purposes of FIG. 1, it is assumed that each pad $C_1$ through $C_9$ can serve both an input and output operation and, therefore, these pads are considered I/O pads as known in the art. Moreover, as also well established in the art, an address is connected to address pads $A_1$ through $A_N$, and decoded by circuit 16 to address a particular row within memory array 12. In response, the data values along that row are either output from the row and columns to data contact pads $C_1$ through $C_9$, or written to those locations from data contact pads $C_1$ through $C_9$.

The linear span of data contact pads $C_1$ through $C_9$ relative to the size and placement of memory array 12 affects design efficiency. For purposes of demonstrating this as well as various objects of the present invention, contact pads $C_1$ through $C_9$ in FIG. 1 span a linear length on the order of 0.400 inch, and each successive pad is approximately 0.040 inch apart from its nearest neighboring pad. The location of the pads raises design issues about the layout of location memory array 12, and the connection and layout of data bus 14. For example, if memory array 12 is small in dimension relative to the linear distance between data contact pads $C_1$ through $C_9$, then the delay time from one array data contact to its corresponding data contact pad may significantly differ between a differing array data contact and its corresponding data contact pad. For example, FIG. 1 is emphasized in this regard to show that the distance between $MD_1$ and $C_1$ is longer than the distance between $MD_5$ and $C_5$. Thus, the communication delay between the second group of contacts will be shorter. In addition, greater bus lengths introduce greater capacitance, and otherwise reduce design efficiency and device operability. Still further, if memory array 12 is not symmetrically located with respect to pads $C_1$ through $C_9$, construction of the circuit is more complicated due to such asymmetries. Lastly, although not shown in FIG. 1, a memory such as that shown may include multiple columns corresponding to each data contact $MD_1$ through $MD_9$. Moreover, for a given data access, and although not shown, one of the multiple columns from $MD_1$ may provide data for connecting to contact $C_9$. Thus, still additional data busing is necessary, thereby increasing busing length and complexity creating problems such as those identified above.

It is therefore an object of the present invention to provide an integrated circuit with widely spread contact pads and particularly designed memory arrays for an efficient layout in view of the contact pad layout.

It is a further object of the present invention to provide such an integrated circuit with unequally-sized paired memory arrays which are selectively coupled to the data contact pads of the integrated circuit.

It is a further object of the present invention to provide such an integrated circuit with unequally-sized paired memory arrays which are selectively coupled to an odd number of data contact pads on the integrated circuit.

It is a further object of the present invention to provide such an integrated circuit with sets of paired memory arrays situated in a fashion symmetric with respect to other paired memory arrays of the circuit.

It is a further object of the present invention to provide such an integrated circuit with sets of paired memory arrays situated in a fashion symmetric with respect to the data contact pads of the integrated circuit.

It is a further object of the present invention to provide such an integrated circuit with sets of paired memory arrays situated in a fashion so as to minimize wasted area on the integrated circuit.

Still other objects and advantages of the present invention will become apparent to those of ordinary skill in the art having references to the following specification together with its drawings.

SUMMARY OF THE INVENTION

In the preferred embodiment, the present invention includes an integrated circuit with an integer odd number C of electrical contacts, wherein each of the electrical contacts is for communicating a data value. The integrated circuit also includes four memory arrays for storing data. The first and third memory arrays are operable to simultaneously output an integer even number E of data values. The second and fourth memory arrays are operable to simultaneously output an integer odd number D of data values. The integrated circuit further includes circuitry for selectively coupling the first, second, third, and fourth memory arrays to the electrical contacts, wherein the circuitry for selectively coupling is operable to couple the first and fourth memory arrays to the electrical contacts in a first state so that the first memory array outputs E data values and the fourth memory array outputs D data values in the first state. The circuitry for selectively coupling is also operable to couple the second and third memory arrays to the electrical contacts in a second state so that the second memory array outputs D data values and the third memory array outputs E data values in the second state.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The preferred embodiment of the present invention and its advantages are best understood by referring to FIGS. 1 through 4 of the drawings, like numerals being used for like and corresponding parts of the various drawings.

Figure 1:
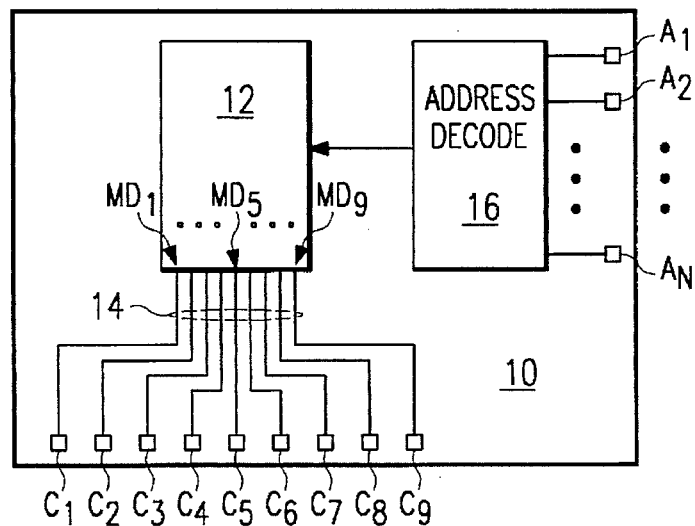
FIG. 1 diagrammatically illustrates an integrated circuit 10 which includes a memory array 12.
Figure 2A:
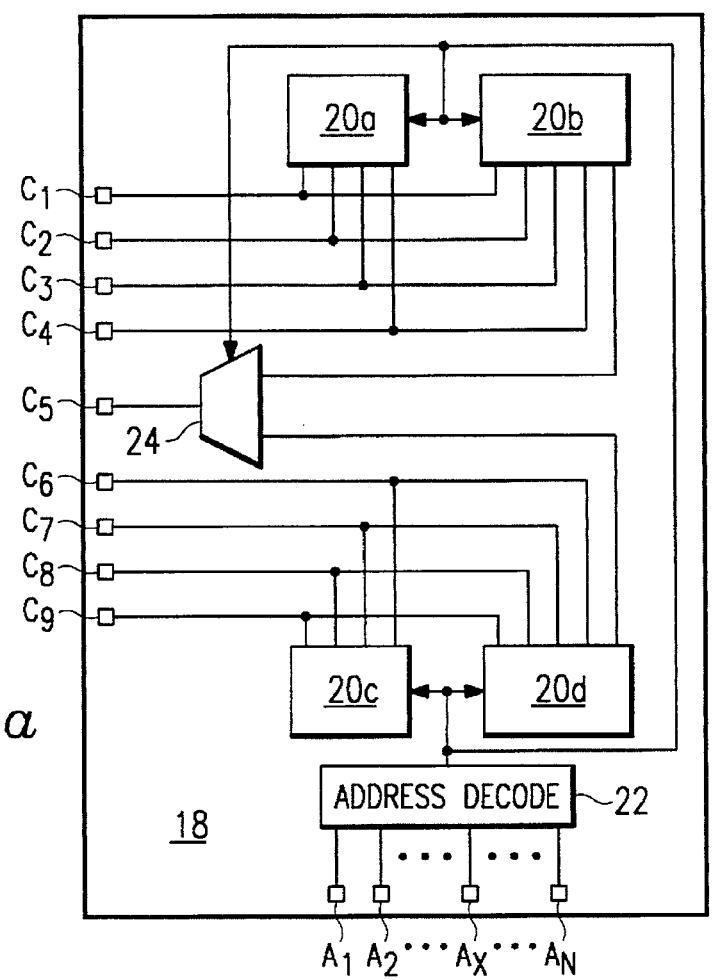
FIG. 2a illustrates an integrated circuit 18 in accordance with the present invention.

FIG. 2a illustrates an integrated circuit 18 in accordance with the present invention. Like integrated circuit 10 of FIG. 1, integrated circuit 18 includes a plurality of data contact pads $C_1$ through $C_9$ and a plurality of address contact pads $A_1$ through $A_N$. Instead of a single memory array, however, integrated circuit 18 includes four memory arrays as follows. Integrated circuit 18 includes a first and second memory array 20a and 20b, where both arrays preferably include the same number of rows, but differ in the number of storage values which each can simultaneously input/output. Particularly, array 20a is operable to input/output four data values at one time, while array 20b is operable to input/output five data values at one time. Integrated circuit 18 further includes a third and fourth memory array 20c and 20d, where both arrays are constructed in the same manner as arrays 20a and 20b, respectively. Thus, arrays 20c and 20d preferably include the same number of rows, but array 20c is operable to input/output four data values at one time, while array 20d is operable to input/output five data values at one time.

In a simple embodiment, the differing input/output capability between array 20a and 20b (or 20c and 20d) may be achieved by constructing array 20a with four columns and array 20b with five columns. As described in connection with later Figures, this simplistic approach is not preferred. However, for purposes of illustrating one aspect of the present invention, it may be assumed that arrays 20a and 20b (or 20c and 20d) are constructed in this demonstrative manner.

Address contact pads $A_1$ through $A_N$ are connected to an address decode circuit 22. Address decode circuit 22 outputs control signals to memory arrays 20a, 20b, 20c, and 22d for purposes of activating locations within those arrays for either reading or writing data. Again, under the assumption that each of the arrays has only the same number of columns as it does data outputs, the control from address decode 22 may be thought of as energizing a row within a given array, and then data will either be written to, or read from, each location along that energized row. The control signal from address decode circuit 22 also connects to a multiplexer 24 for reasons described below.

Data contact pads $C_1$ through $C_4$ are connected to the four data outputs of array 20a; in addition, however, these same contact pads are connected to four of the five data outputs of array 20b. Similarly, data contact pads $C_6$ through $C_9$ are connected to the four data outputs of array 20c, while these same contact pads are connected to four of the five data outputs of array 20d. Data contact pad $C_5$ is connected to the output of multiplexer 24. The inputs of multiplexer 24 are connected to the fifth data outputs of arrays 20b and 20d, that is, those data outputs which are not connected to either data contact pads $C_1$ through $C_4$ or data contact pads $C_6$ through $C_9$.

Figure 2B:
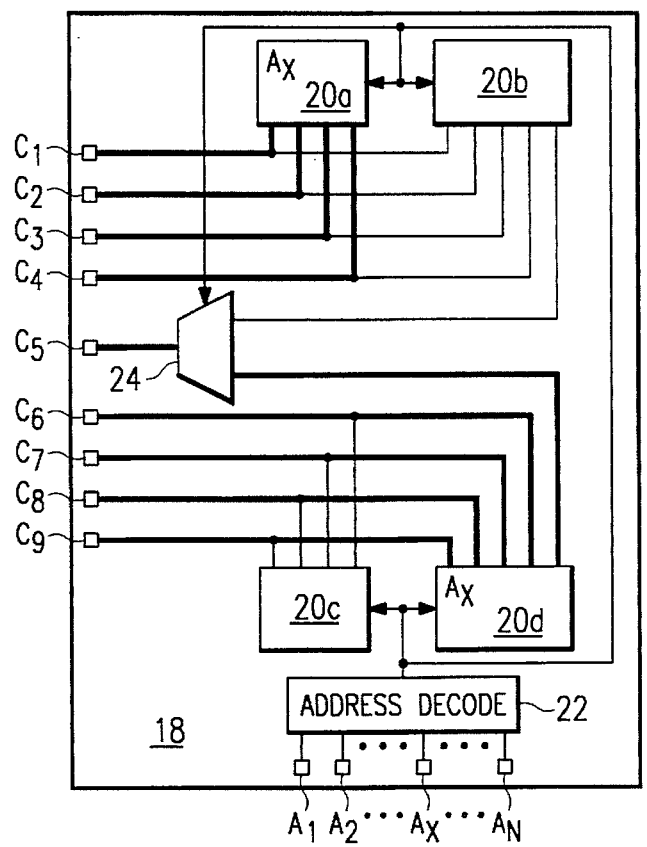
FIG. 2b illustrates the selection of four bit array 20a and five bit array 20d for communicating data in a first state.
Figure 2C:
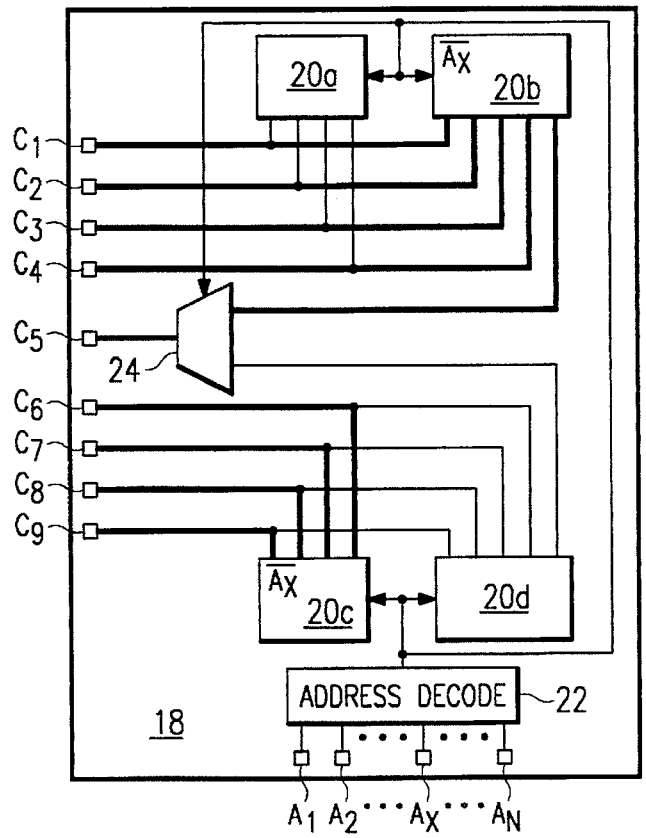
FIG. 2c illustrates the selection of five bit array 20b and four bit array 20c for communicating data in a second state.

The operation of the circuitry of FIG. 2a follows, and is illustrated by darkened data paths in FIGS. 2b and 2c. Before discussing those Figures, however, note that the selection among the four arrays in FIG. 2a is one key aspect of the present invention. In particular, during a given memory access of the present invention, a nine bit data value is communicated to contact pads $C_1$ through $C_9$ by selecting one four bit array (either 20a or 20c), and one five bit array (either 20b or 20d). Further, because of the common bus connections of arrays 20a and 20b (and 20c and 20d), the selection is such that if array 20a is selected as the four bit array, then array 20d is selected as the five bit array. Conversely, if array 20c is selected as the four bit array, then array 20b is selected as the five bit array. Thus, from a layout perspective, array selection is such that, for a given data I/O, two diagonally situated arrays are accessed, while the two other diagonally situated arrays are not.

The particular combination of selected arrays is directed by the cumulative address, $A_1$ through $A_N$. More particularly, this cumulative address includes a predesignated bit $A_X$ which determines which diagonally situated arrays are selected as described below in connection with FIGS. 2b and 2c. While $A_X$ is shown in FIG. 2a as located between $A_1$ and $A_N$, one skilled in the art will readily appreciate that $A_X$ could be located anywhere among the address bits, and therefore could coincide with either $A_1$ or $A_N$.

FIG. 2b illustrates the selection of four bit array 20a and five bit array 20d. This alternative selection is accomplished in response to the value of $A_X$ being in one logic state which, for purposes of example, consider as a logical high. This is denoted in FIG. 2b by labeling arrays 20a and 20d with an "$A_X$" in the upper left corner of each of those two arrays. In addition, the darkened data path in FIG. 2b demonstrates the path of data between the selected arrays and contact pads $C_1$ through $C_9$. Thus, it may be readily appreciated that four data values are communicated between array 20a and pads $C_1$ through $C_4$, while five data values are communicated between array 20d and pads $C_5$ through $C_9$. With respect to the latter, note also that the value of $A_X$ causes multiplexer 24 to connect its lower input to its output in this instance, thereby communicating the fifth data value between array 20d and pad $C_5$.

FIG. 2c illustrates the selection of four bit array 20b and five bit array 20c. This alternative selection is accomplished in response to the value of $A_X$ being the opposite logic state which, therefore, in the current example, is a logical low. This is denoted in FIG. 2c by labeling arrays 20c and 20b with an "$\overline{A_X}$" in the upper left corner of each of those two arrays. In addition, the darkened data path in FIG. 2c demonstrates the path of data between the selected arrays and contact pads $C_1$ through $C_9$. Again, therefore, it may be readily appreciated that five data values are communicated between array 20b and pads $C_1$ through $C_5$, while four data values are communicated between array 20c and pads $C_6$ through $C_9$. Multiplexer 24 operates similarly to the above, but in this instance the value of $A_X$ causes it to connect its upper input to communicate the fifth data value between array 20b and pad $C_5$.

Given the above, therefore, the present invention provides an efficient layout of the integrated circuit memory arrays in view of the contact pad layout. Moreover, the unequal sizing of the paired memory arrays accommodates an odd number of data contact pads, but does so in a manner to optimize symmetry and minimize wasted area which might otherwise arise from an asymmetric design on an integrated circuit. Moreover, recall from above that the four arrays of FIGS. 2a–c are simplified in width to demonstrate an inventive concept. As shown below, however, this concept is expandable to accommodate more efficient array design without departing from the operational techniques set forth above.

Figure 3A:
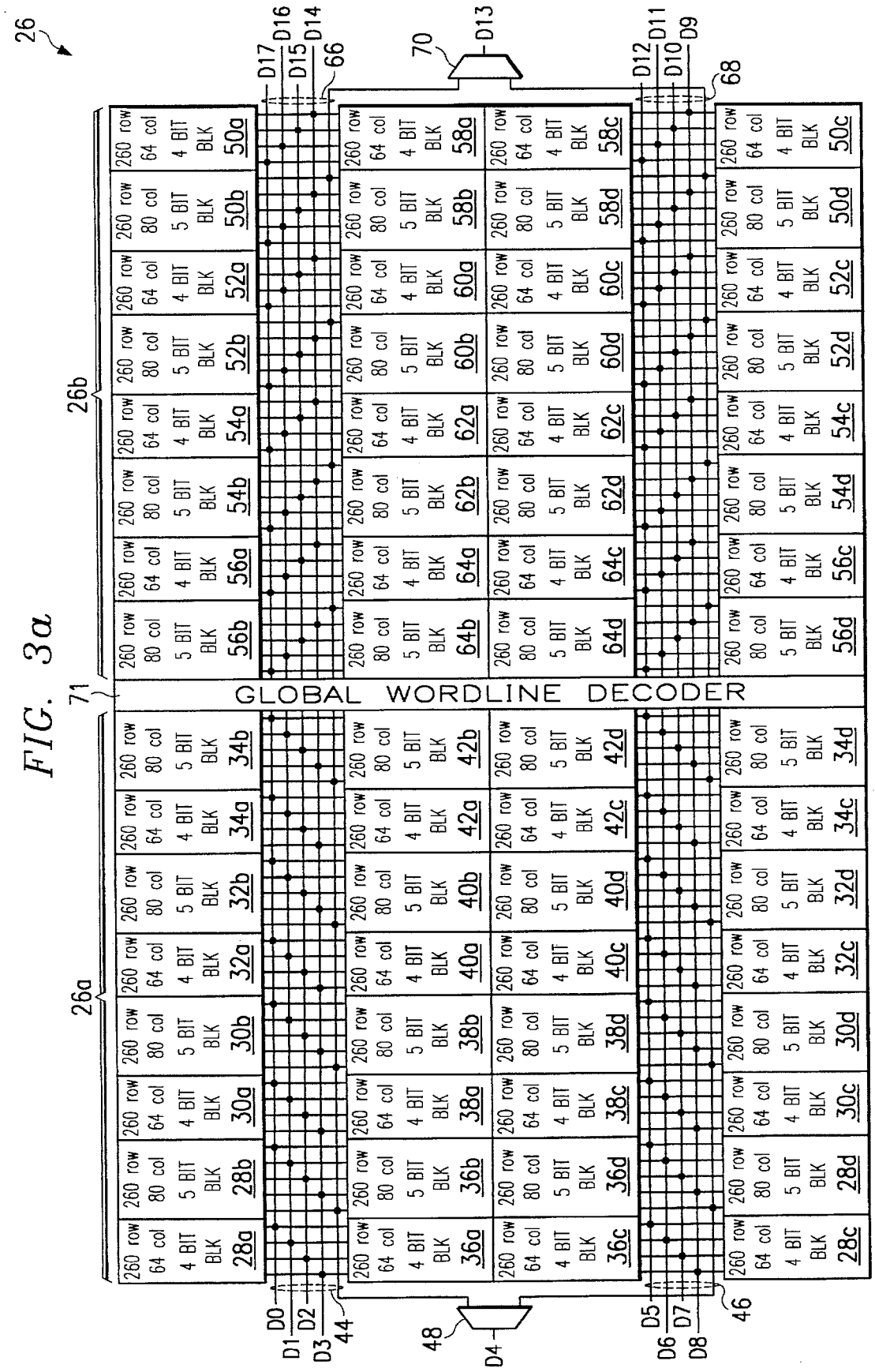
FIG. 3a illustrates a diagrammatic drawing of the invention of FIGS. 2a–2c, but expanded in number of arrays and circuitry to demonstrate an exemplary embodiment of the present invention.

Having described the above aspects of the invention, FIG. 3a illustrates a diagrammatic drawing of the invention in an exemplary embodiment of an integrated circuit 26. Particularly, integrated circuit 26 includes a 64 k×18 bit overall memory operable to input/output an 18 bit data quantity using an expanded version of the configuration shown in FIGS. 2a–c. Integrated circuit 26 is best understood by considering its left and right halves which are symmetric with respect to one another, and which therefore are referenced as 26a and 26b, respectively.

Integrated circuit half 26a includes numerous arrays generally situated in the same fashion as in FIGS. 2a–c, but duplicated and enhanced in structure to permit greater storage and efficiency. For example, integrated circuit half 26a includes a four bit array 28a and a five bit array 28b. Integrated circuit half 26a further includes a four bit array 28c and a five bit array 28d. To demonstrate the similarity of operation, note that the use of letters in combination with the reference numbering scheme from FIGS. 2a–c is carried forward with respect to the arrays in FIGS. 3a–c. Thus, arrays 28c and 28d are symmetric to arrays 28a and 28b, and further are connected to operate by selecting diagonally situated arrays in the same manner as FIGS. 2a–c. This operation is discussed later in connection with FIGS. 3b–c.

Given the use of the same convention between FIGS. 2a–c and 3a–c, note that integrated circuit half 26a further include numerous sets of four arrays, where each set includes a common reference number coupled with either an "a" or "c" to indicate a four bit array, or a "b" or "d" to indicate a five bit array. For further example, therefore, there is a set of four arrays labeled 30a, 30b, 30c, and 30d. Again, the use of the same reference number indicates the relationship of the four arrays, that is, that they operate in a diagonally situated and alternately switched fashion such that when one four bit array of the set is energized, so is the five bit array which is part of the set of four arrays and diagonally situated from the energized four bit array. This convention is followed for all of integrated circuit half 26a (and 26b) and, therefore, includes the designation of arrays 32a–d through 42a–d.

Figure 3B:
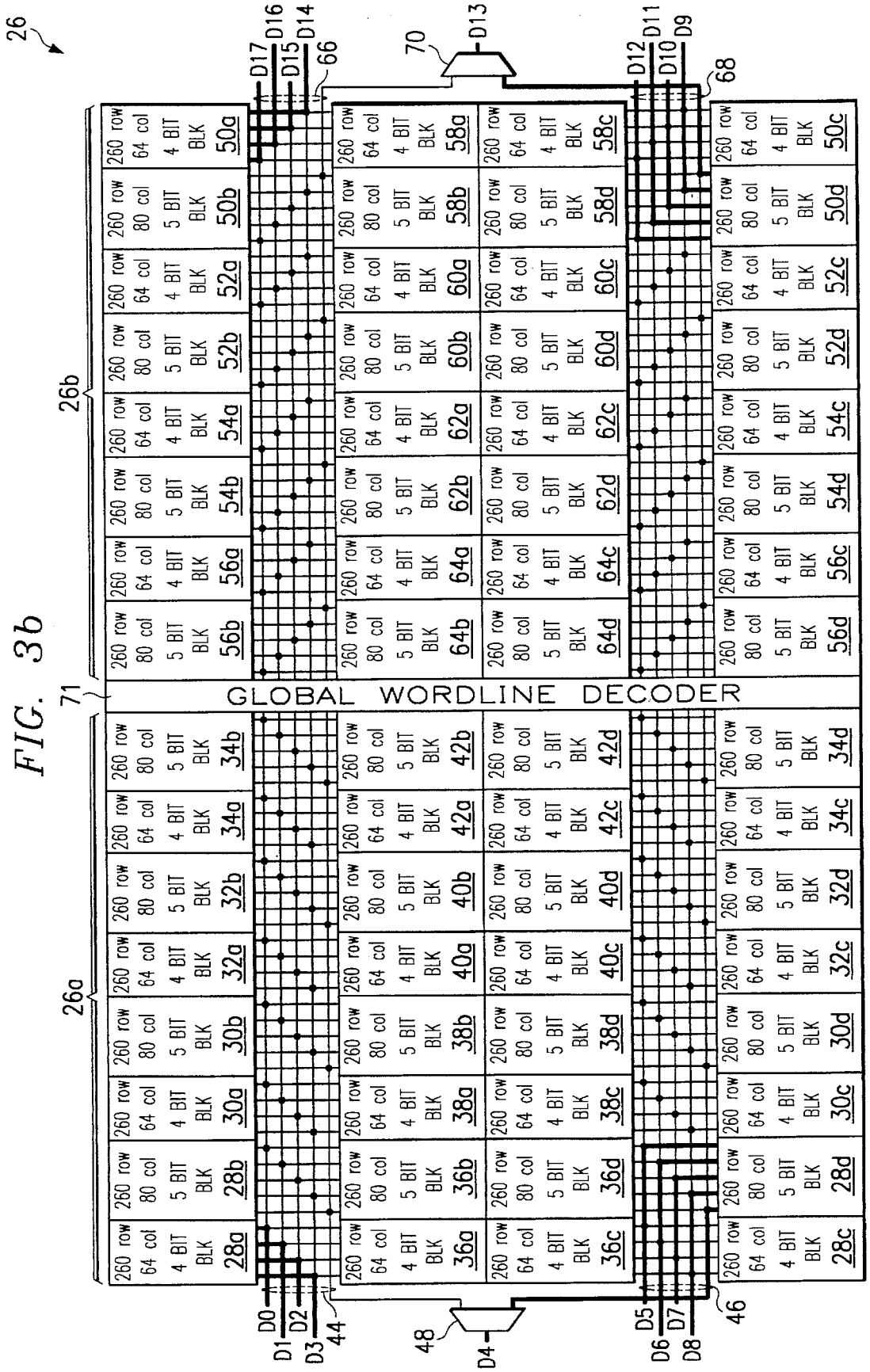
FIG. 3b demonstrates the similarity of operation between the arrays of FIGS. 2a–c and groupings of arrays of FIGS. 3a–c.
Figure 3C:
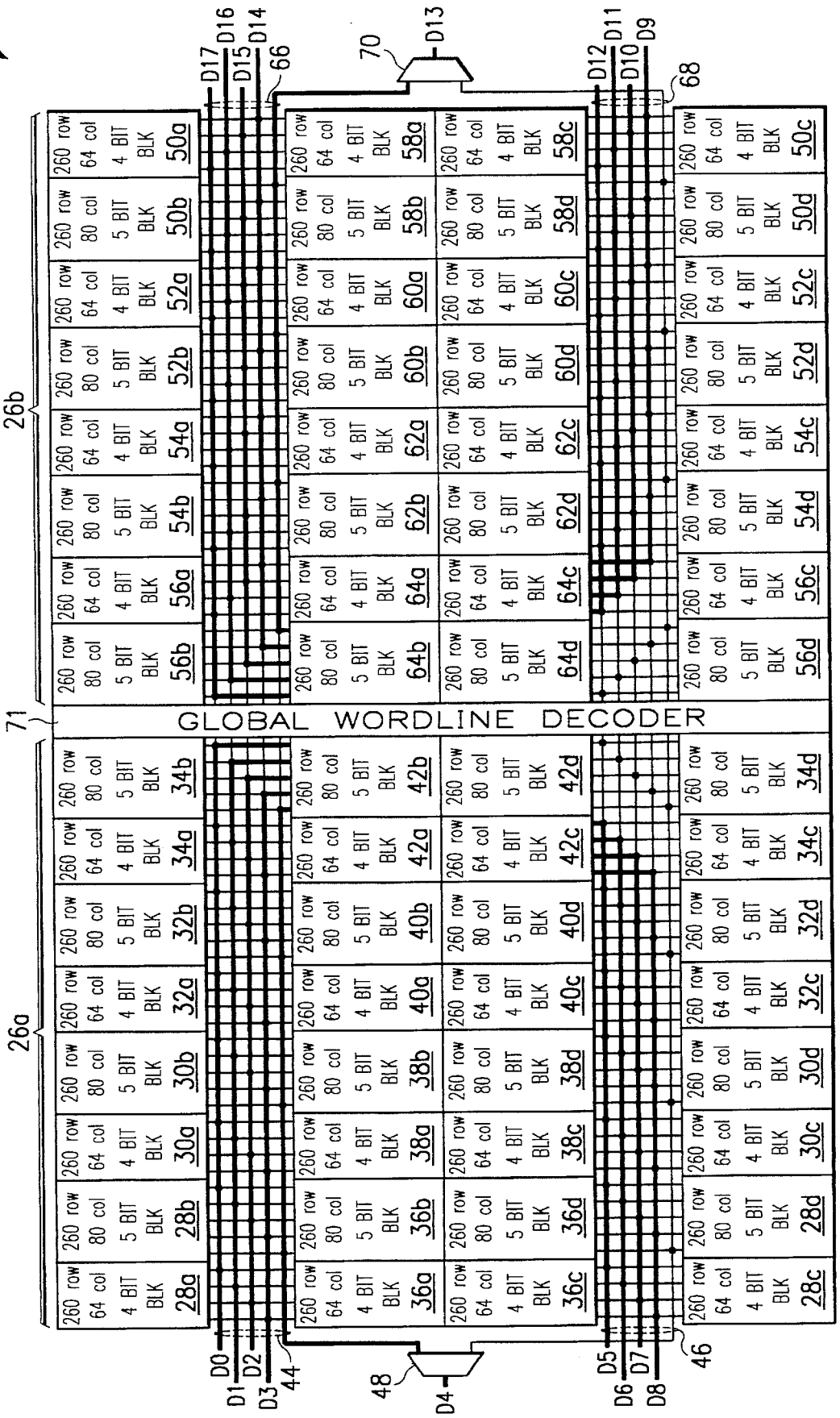
FIG. 3c demonstrates another example of operation of the arrays of FIGS. 3a–c, with it shown how the symmetrically oriented arrays can utilize common data buses 44 and 46.

Before proceeding with an operational discussion of FIGS. 3a–c, note that while the arrays shown in those Figures are also referred to as "four bit" or "five bit", this description is only intended to refer to the instantaneous data I/O capability of a given array rather than its number of columns (or storage elements). In other words, each of the arrays of FIGS. 3a–c physically includes many more than four or five columns as the legend shows in the Figure, and as detailed below in FIG. 4. However, when performing an I/O operation, these arrays either input or output only four columns (for a "four bit" array) or five columns (for a "five bit" array) at one time. Thus, overall storage size is increased, but a single array access yields either four or five bits, depending on the particular array.

Having explained the demonstrative use of reference numbers in FIGS. 3a–c, one skilled in the art will also appreciate the connections of the remaining arrays to the data buses shown in those Figures. Particularly, integrated circuit half 26a includes two five-bit data buses 44 and 46. Four of the five lines within data bus 44 are connected to communicate data designated D0 through D3, while the fifth data line of that bus is connected to a first input of a multiplexer 48. Similarly, four of the five lines within data bus 46 are connected to communicate data designated D5 through D9, while the fifth data line of that bus is connected to a second input of multiplexer 48.

Lastly, note that the elements of integrated circuit half 26b are symmetrically duplicated from integrated circuit half 26a. Thus, the half 26b includes eight groupings of arrays designated 50a–d through 64a–d. In addition, half 26b includes two five bit data buses 66 and 68, with a symmetric connection to data buses 44 and 46; thus, four of the five data lines of buses 68 and 66 are connected to communicate data D9 through D12 and D14 through D17, respectively. The fifth data line of each of buses 66 and 68 is connected to the respective inputs of a multiplexer 70 and the output of multiplexer 17 communicates data D13.

Integrated circuit halves 26a and 26b are structurally and operationally symmetric with respect to one another and are separated by a global wordline decoder 71. Although not shown, data D0 through D17 are connected to contact pads, which may be further connected to pins once integrated circuit 26 is packaged. Moreover, note therefore that the overall number of contacts is even (i.e., eighteen), but the number of contacts for each set of four arrays is odd (i.e., nine).

FIG. 3b demonstrates the similarity of operation between the arrays of FIGS. 2a–c and groupings of arrays of FIGS. 3a–c. The example of operation of the circuitry of FIG. 3b is illustrated by its darkened data paths. In addition, for simplifying the drawings, FIGS. 3a–c do not show address inputs and/or an address decoder. However, like FIGS. 2a–c, it is understood that the integrated circuit will include such devices. Moreover, one bit (e.g., $A_X$) of the multiple bit address will be decoded in order to energize the arrays in the diagonally situated manner described above. Thus, for the example of FIG. 3b, when this particular address bit selects array 28a to communicate four bits of data, it simultaneously selects array 28d to communicate five bits of data. Thus, four bit array 28a communicates data D0 through D3, while five bit array 28d communicates data D4 through D8. In connection with the latter, note again that D4 connects through multiplexer 48 to the fifth bit from five bit array 28d. Although not shown, one skilled in the art will also appreciate that the converse operation is also true, that is, when array 28b is selected to communicate five bits of data, array 28c is simultaneously selected to communicate four bits of data.

FIG. 3b also demonstrates the symmetry of operation between integrated circuit halves 26a and 26b. As shown, in half 26a, the two arrays of the group of four arrays 28a–d are involved during the memory access. Consequently, simultaneously involved during the memory access are the corresponding arrays symmetrically located in half 26b, namely, two of the four arrays in group 50a–d. More particularly, and as shown by the darkened data path, four bit array 50a communicates data D14 through D17, while five bit array 50d communicates data D9 through D13. Moreover, in connection with the latter, note that D13 connects through multiplexer 70 to the fifth bit from five bit array 50d.

FIG. 3c demonstrates another example of operation of the arrays of FIGS. 3a–c, with it shown how the symmetrically oriented arrays can utilize common data buses 44 and 46. Again, the example of operation is illustrated by darkened data paths. In FIG. 3c, therefore, and with reference to circuit half 26a, the two arrays of the group of four arrays 42a–d are involved during the memory access. More particularly, five bit array 42b communicates data D0 through D4, while four bit array 42c communicates data D5 through D8. Similarly, with reference to integrated circuit half 26b, five bit array 64b communicates data D13 through D17, while four bit array 64c communicates data D9 through D12.

In view of FIGS. 3b and 3c, above, one skilled in the art will appreciate the benefit of the common connection between arrays and data buses 44 and 46 in integrated circuit half 26a, and the similar common connection between arrays and data buses 66 and 68 in integrated circuit half 26b. For example, a first linearly arranged set of arrays 28a–b, 30a–b, 32a–b, and 34a–b share connections to data bus 44 with a second linearly arranged set of arrays 36a–b, 38a–b, 40a–b, and 42a–b. However, from a comparison of FIGS. 3b and 3c, note that only one of the two linearly arranged sets of arrays use data bus 44 at a single time. Thus, only a single data bus 44 is needed to accommodate these numerous arrays. In addition, note further the same relationship with respect to data bus 46, namely, that a third linearly arranged set of arrays 28c–d, 30c–d, 32c–d, and 34c–d share connections to data bus 46 with a fourth linearly arranged set of arrays 36c–d, 38c–d, 40c–d, and 42c–d. Given the above, therefore, only two data buses 44 and 46 are needed to service each of the arrays, and to maintain the operation of diagonally situated arrays as described above.

Figure 4:
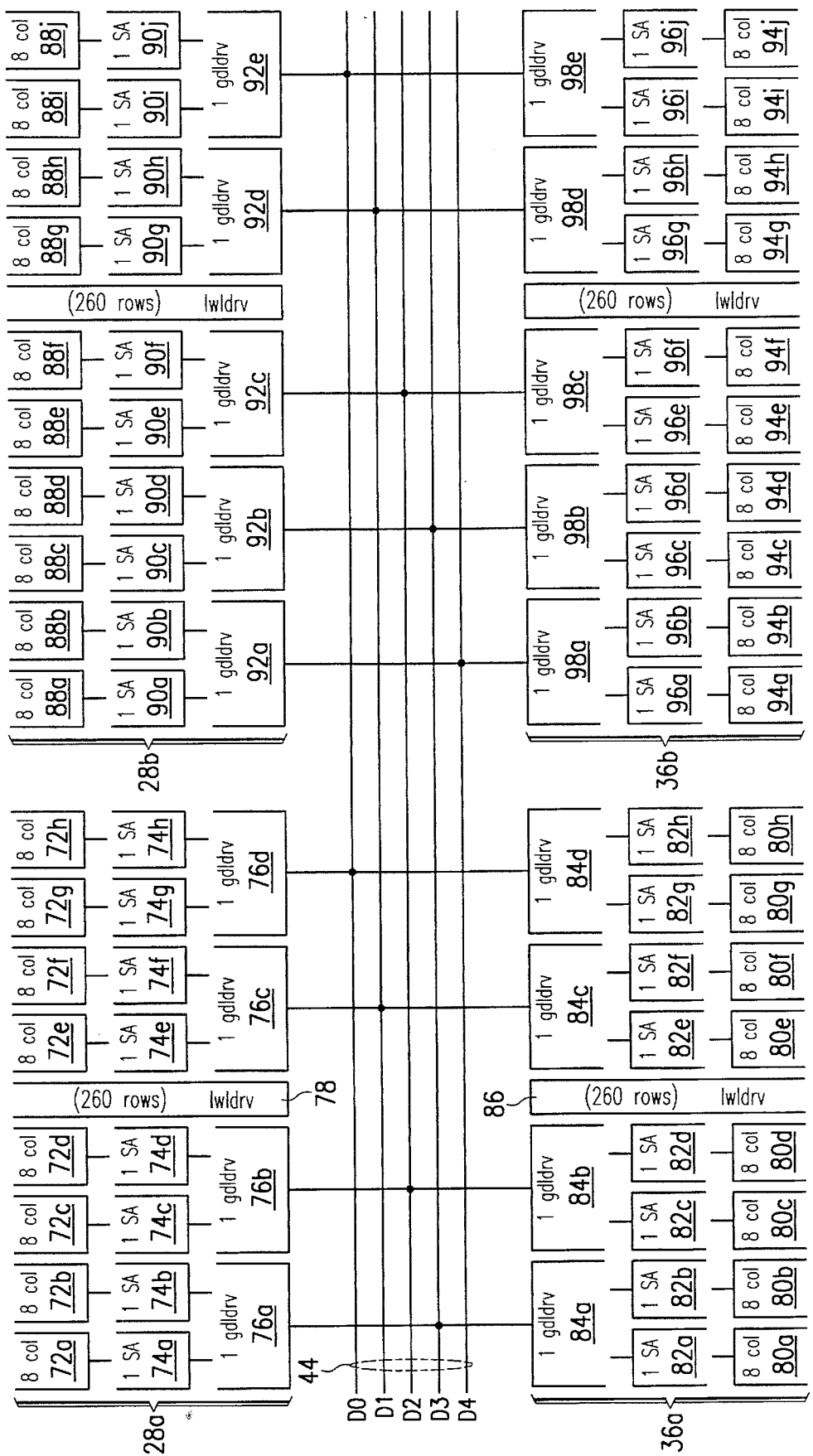
FIG. 4 diagrammatically illustrates an example of construction of one of the four and five bit arrays of FIGS. 3a–3c as well as the sharing of a data bus by those arrays.

FIG. 4 diagrammatically illustrates an example of one of the four and five bit arrays of FIGS. 3a–3c as well as the sharing of a data bus by those arrays. Regarding the particular example, FIG. 4 illustrates four bit arrays 28a and 36a as connected to data bus 44, and FIG. 4 further illustrates five bit arrays 28b and 36b, also as connected to data bus 44.

Array 28a includes eight sets of column groups 72a–h and each of these groups includes eight columns. A sense amplifier 74a–h is connected to each of the respective sets of eight column groups 72a–h. The sense amplifiers are then paired, such that amplifiers 74a and 74b connect to a global data driver 76a and amplifiers 74c and 74d connect to a global data driver 76b. Similarly, sense amplifiers 74e and 74f connect to a global data driver 76c, while amplifiers 74g and 74h connect to a global data driver 76d. Global data drivers 76a–d are connected to data bus 44, and more particularly, to D3 through D0, respectively. Finally, array 28a includes a local word line driver 78. Although not shown, local word line driver 78 includes 260 word lines which span perpendicularly across each of the eight sets of eight column groups 72a–h. Note that 256 of these 260 wordlines are operational, while the remaining four wordlines are redundant for purposes known in the art.

Array 36a is constructed in an identical manner as array 28. Thus, array 36a includes eight sets of eight column groups 80a–h which connect to corresponding sense amplifiers 82a–h. The sense amplifiers are paired as shown to global data drivers 84a–d. Global data drivers 84a–d are also connected to data bus 44, and more particularly, to D3 through D0, respectively. Finally, array 36a includes a local word line driver 86. Again, although not shown, local word line driver 86 includes 260 word lines which span perpendicularly across each of the eight sets of eight column groups 80a–h.

The operation of arrays 28a and 36a are generally understood with reference back to FIGS. 3b and 3c, and further in connection with FIG. 4. First, as demonstrated above, because arrays 28a and 36a share data bus 44, only one of the two arrays may be accessed at a time. Thus, consider the example of an access of array 28a. First local word line 78 energizes one of its 260 rows, thereby activating each data location where that row intersects the eight sets of eight column groups 72a–h. Next, each of sense amplifiers 74a–h selects one of the eight columns from its respect column group. For example, amplifier 74a may select the third column in column group 72a. Similarly, the remaining sense amplifiers 74b–h also select one column from a respective group in like manner. Thus, the accumulation of sense amplifiers 74a–h operates to choose a total of eight columns. Next, each of the four global data drivers 76a–d selects one of the two sense amplifiers from its two respective sense amplifiers. For example, global data driver 76a may select sense amplifier 74b. Similarly, the remaining global data drivers 76b–d also select from two respective sense amplifiers in like manner. Thus, the accumulation of global data drivers 76a–d operates to connect D3 through D0 of data bus 44 to only four columns out of the 64 possible columns included in groups 72a–h. Finally, note that the operation of array 36a is the same as that of array 28a, with sense amplifiers 82a–h selecting columns from groups 80a–h, followed by global data drivers 84a–d selecting four of the eight sense amplifiers 82a–h to connect four data bits between the data columns and data bus 44. Still further, the operation of array 36b is the same as that of array 28b, with sense amplifiers 96a–h selecting columns from groups 94a–h, followed by global data drivers 98a–d selecting four of the eight sense amplifiers 96a–h to connect four data bits between the data columns and data bus 44.

Five bit arrays 28b and 36b are constructed in the same fashion as four arrays 28a and 36a described above, but include an additional two sets of eight bit column groups, corresponding sense amplifiers, and a corresponding global data driver for the additional columns and sense amplifiers. Thus, without repeating the level of detail above, one skilled in the art will appreciate that the five bit operation is similar to the four bit operation, with the addition of circuitry to accommodate the additional fifth bit. For example, after sense amplifiers 90a–j select single columns, global data drivers 92a–e select from one of two corresponding sense amplifiers. As a result, a five bit quantity connects between the selected columns and D0 through D4 of data bus 44.

Lastly, as noted above, the addressing contacts and decoders are not shown in FIGS. 3a through 4. Instead, it is known to a person skilled in the art that various logic circuits and the like may be implemented to ensure proper timing, decoding and power-on operation of the addressing functionality.

From the above, it may be appreciated that the embodiments of the present invention provide numerous benefits and objects as set forth above. Further, while the present invention has been described in detail, various substitutions, modifications or alterations have been described which demonstrate its flexibility and inventive scope. In addition, still other such variations could be made to the descriptions set forth above. For example, the contact pads and corresponding package pins are described herein as I/O pads or pins; however, the present invention could apply to memories having only an output capability (i.e., read-only memory), wherein the contact pads and corresponding package pins were solely output devices. These read only memory devices may be one of many types, such as mask-programmed type or electrically programmable. Further, the present invention could apply to various other types of memories, such as particularized random access memories (static or dynamic). Still other changes may be achieved by a person skilled in the art without departing from the invention which is defined by the following claims.

What is claimed is:

1. An integrated circuit, comprising:
   an integer odd number C of electrical contacts, wherein each of said electrical contacts is for communicating a data value;
   a first memory array for storing data values, wherein said first memory array is operable to simultaneously output an integer even number E of data values;
   a second memory array for storing data values, wherein said second memory arrays is operable to simultaneously output an integer odd number D of data values;
   a third memory array for storing data values, wherein said third memory array is operable to simultaneously output said integer E of data values;
   a fourth memory array for storing data values, wherein said fourth memory array is operable to simultaneously output said integer D of data values; and
   circuitry for selectively coupling said first, second, third, and fourth memory arrays to said electrical contacts;
   wherein said circuitry for selectively coupling is operable to couple said first and fourth memory arrays to said electrical contacts in a first state so that said first memory array outputs the E data values and said fourth memory array outputs the D data values in said first state; and
   wherein said circuitry for selectively coupling is operable to couple said second and third memory arrays to said electrical contacts in a second state so that said third memory array outputs the E data values and said second memory array outputs the D data values in said second state.

2. The integrated circuit of claim 1 wherein each of said electrical contacts are identifiable by an ascending numerical reference from one to said integer C;
   wherein said circuitry for selectively coupling is operable to couple said first memory array in said first state to said electrical contacts identifiable from one to said integer E; and
   wherein said circuitry for selectively coupling is operable to couple said fourth memory array in said first state to said electrical contacts identifiable from an integer equal to E+1 to said integer C.

3. The integrated circuit of claim 2:
   wherein said circuitry for selectively coupling is operable to couple said second memory array in said second state to said electrical contacts identifiable from one to said integer D; and
   wherein said circuitry for selectively coupling is operable to couple said third memory array in said second state to said electrical contacts identifiable from an integer equal to D+1 to said integer C.

4. The integrated circuit of claim 1 wherein each of said electrical contacts are identifiable by an ascending numerical reference from one to said integer C;
   wherein said circuitry for selectively coupling is operable to couple said second memory array in said second state to said electrical contacts identifiable from one to said integer D; and
   wherein said circuitry for selectively coupling is operable to couple said third memory array in said second state to said electrical contacts identifiable from an integer equal to D+1 to said integer C.

5. The integrated circuit of claim 1 wherein said integer E equals $(C-1) \div 2$.

6. The integrated circuit of claim 1 wherein said integer D equals $((C-1) \div 2)+1$.

7. The integrated circuit of claim 1 wherein said integer C equals nine electrical contacts, wherein said even number E of data values of said first and third memory arrays equals four, and wherein said odd number D of data values of said second and fourth memory arrays equals five data values.

8. The integrated circuit of claim 1:
   wherein each of said first, second, third, and fourth memory arrays comprise a same number of rows;
   wherein each of said first and said third memory arrays comprise a first number of columns; and
   wherein each of said second and said fourth memory arrays comprise a second number of columns different from said first number of columns.

9. The integrated circuit of claim 8 wherein said first number of columns equals an integer multiple of said integer E, and wherein said second number of columns equals an integer multiple of said integer D.

10. The integrated circuit of claim 9 wherein each of said integer multiples exceeds one.

11. The integrated circuit of claim 1:
    wherein said first, second, third, and fourth memory arrays are located on respective positions of a layout area of said integrated circuit; and
    wherein said positions of said first and second memory arrays on said layout area are symmetric with respect to said positions of said third and fourth memory arrays.

12. The integrated circuit of claim 11:
    wherein said positions of said first and second memory arrays define a first linear region;
    wherein said positions of said third and fourth memory arrays define a second linear region; and
    wherein said first linear region is substantially parallel to said second linear region.

13. The integrated circuit of claim 1 wherein said first, second, third, and fourth memory arrays comprise a first group of memory arrays, and further comprising a second group of memory arrays, said second group of memory arrays comprising:

a first memory array for storing data values, wherein said first memory array is operable to simultaneously output said integer even number E of data values;

a second memory array for storing data values, wherein said second memory array is operable to simultaneously output said integer odd number D of data values;

a third memory array for storing data values, wherein said third memory array is operable to simultaneously output said integer E of data values;

a fourth memory array for storing data values, wherein said fourth memory array is operable to simultaneously output said integer D of data values;

wherein said circuitry for selectively coupling is operable to couple said first and fourth memory arrays of said second group to said electrical contacts in said first state so that said first memory array outputs the E data values and said fourth memory array outputs the D data values in said first state; and wherein said circuitry for selectively coupling is operable to couple said second and third memory arrays of said second group to said electrical contacts in said second state so that said third memory array outputs the E data values and said second memory array outputs the D data values in said second state.

14. The integrated circuit of claim 13 and further comprising:

a first data bus comprising said integer D of conductor lines, wherein said first and second memory arrays of said first and second groups are coupled to communicate data with said first data bus; and a second data bus comprising said integer D of conductor lines, wherein said third and fourth memory arrays of said first and second groups are coupled to communicate data with said second data bus.

15. The integrated circuit of claim 14 and further comprising a multiplexer connected to one conductor line of each of said first and second data buses, wherein said multiplexer is operable to select said one conductor line of said first data bus in said first state and to select said one conductor line of said second data bus in said second state.

16. The integrated circuit of claim 1 and further comprising:

a first data bus comprising said integer D of conductor lines, wherein said first and second memory arrays are coupled to communicate data with said first data bus; and a second data bus comprising said integer D of conductor lines, wherein said third and fourth memory arrays are coupled to communicate data with said second data bus.

17. The integrated circuit of claim 16 and further comprising a multiplexer connected to one conductor line of each of said first and second data buses, wherein said multiplexer is operable to select said one conductor line of said first data bus in said first state and to select said one conductor line of said second data bus in said second state.

18. The integrated circuit of claim 1 and further comprising means for receiving an address, wherein said address controls said circuitry for selectively coupling to operate in either of said first and second states.

19. An integrated circuit, comprising:

an integer odd number C of electrical contacts, wherein each of said electrical contacts is for communicating a data value;

a first memory array for storing data values, wherein said first memory array is operable to simultaneously output an integer even number E of data values, wherein said integer E equals $(C-1) \div 2$;

a second memory array for storing data values, wherein said second memory array is operable to simultaneously output an integer odd number D of data values, wherein said integer D equals $(C-1) \div 2 + 1$;

a third memory array for storing data values, wherein said third memory array is operable to simultaneously output said integer E of data values;

a fourth memory array for storing data values, wherein said fourth memory array is operable to simultaneously output said integer D of data values; and circuitry for selectively coupling said first, second, third, and fourth memory arrays to said electrical contacts;

wherein said circuitry for selectively coupling is operable to couple said first and fourth memory arrays to said electrical contacts in a first state so that said first memory array outputs the E data values and said fourth memory array outputs the D data values in said first state; and wherein said circuitry for selectively coupling is operable to couple said second and third memory arrays to said electrical contacts in a second state so that said third memory array outputs the E data values and said second memory array outputs the D data values in said second state.

20. The integrated circuit of claim 19:

wherein each of said first, second, third, and fourth memory arrays comprise a same number of rows;

wherein each of said first and said third memory arrays comprise a first number of columns; and wherein each of said second and said fourth memory arrays comprise a second number of columns greater than said first number of columns.

21. The integrated circuit of claim 19:

wherein said first, second, third, and fourth memory arrays are located on respective positions of a layout area of said integrated circuit;

wherein said positions of said first and second memory arrays define a first linear region;

wherein said positions of said third and fourth memory arrays define a second linear region; and wherein said first linear region is substantially parallel to said second linear region.

22. A memory in an integrated circuit, comprising:

a plurality of memory cells, arranged in a first, second, third, and fourth memory array;

circuitry for selecting an even number of said plurality of memory cells from said first memory array for access in response to a first address value;

circuitry for selecting an odd number of said plurality of memory cells from said fourth memory array for access in response to said first address value;

circuitry for selecting the even number of said plurality of memory cells from said third memory array for access in response to a second address value, wherein said second address value differs from said first address value; and circuitry for selecting the odd number of said plurality of memory cells from said second memory array for access in response to said second address value.

23. The memory of claim 22 wherein each of said first and second address values comprise a plurality of bits, and wherein one of said plurality of bits is designated in a first state to indicate selection of said first and fourth memory arrays and in a second state to indicate selection of said second and third memory arrays.

* * * * *